(12) United States Patent
Yamada

(10) Patent No.: US 9,412,918 B2
(45) Date of Patent: Aug. 9, 2016

(54) LIGHT EMITTING DEVICE AND METHOD OF MANUFACTURING THE SAME

(71) Applicant: NICHIA CORPORATION, Anan-shi, Tokushima (JP)

(72) Inventor: Motokazu Yamada, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 13/944,982

(22) Filed: Jul. 18, 2013

(65) Prior Publication Data

US 2014/0021506 A1 Jan. 23, 2014

(30) Foreign Application Priority Data

Jul. 19, 2012 (JP) .................................. 2012-160183

(51) Int. Cl.
*H01L 33/52* (2010.01)
*H01L 33/38* (2010.01)
*H01L 33/62* (2010.01)

(52) U.S. Cl.
CPC ................ *H01L 33/52* (2013.01); *H01L 33/38* (2013.01); *H01L 33/62* (2013.01); *H01L 2224/13* (2013.01); *H01L 2224/73204* (2013.01); *H01L 2933/005* (2013.01); *H01L 2933/0066* (2013.01)

(58) Field of Classification Search
CPC ......... H01L 33/52; H01L 33/54; H01L 33/62; H01L 2933/005; H01L 2933/0066; H01L 2224/48247; H01L 2224/73203; H01L 2224/73215; H01L 33/38; H01L 24/26; H01L 24/28; H01L 24/29; H01L 24/30

USPC .............. 257/99, 100, 687, 778; 438/26, 108, 438/118, 125, 126

See application file for complete search history.

(56) References Cited

U.S. PATENT DOCUMENTS

| | | | | |
|---|---|---|---|---|
| 5,864,178 A * | 1/1999 | Yamada et al. | | 257/737 |
| 5,959,363 A | 9/1999 | Yamada et al. | | |
| 6,055,724 A * | 5/2000 | Nishino | | H01L 21/56 257/E21.502 |
| 6,324,069 B1 * | 11/2001 | Weber | | H01L 21/563 174/260 |
| 6,614,122 B1 * | 9/2003 | Dory | | H01L 21/563 257/783 |

(Continued)

FOREIGN PATENT DOCUMENTS

| | | |
|---|---|---|
| JP | 09-036177 A | 2/1997 |
| JP | 11-168235 A | 6/1999 |

(Continued)

*Primary Examiner* — Fernando L Toledo
*Assistant Examiner* — Christine L Hagan
(74) *Attorney, Agent, or Firm* — Global IP Counselors, LLP

(57) ABSTRACT

A light emitting device includes a support member, a light emitting element, and an underfill material. The support member includes an insulating member and positive and negative electrically conductive wirings arranged on the insulating member. The electrically conductive wirings are insulated and separated from each other by an insulating region arranged between the positive and negative electrically conductive wirings. The insulating separation region includes a first region disposed on an outer side with respect to the light emitting element and a second region disposed directly under the light emitting element. The first region includes an underfill arranging portion in which an interval between the electrically conductive wirings is wider than in the second region. The underfill material is arranged to extend from the underfill arranging portion to the second region in a space formed between the support member and the light emitting element.

19 Claims, 7 Drawing Sheets

(56) References Cited

U.S. PATENT DOCUMENTS

| | | | | |
|---|---|---|---|---|
| 6,617,521 B1* | 9/2003 | Saito | H01L 24/27 | |
| | | | 174/260 | |
| 6,653,720 B2* | 11/2003 | Kameda | H01L 21/563 | |
| | | | 257/667 | |
| 6,809,406 B2* | 10/2004 | Yoshiike | H01L 21/563 | |
| | | | 257/668 | |
| 6,977,686 B2* | 12/2005 | Shinomiya | H01L 24/32 | |
| | | | 257/778 | |
| 7,193,328 B2* | 3/2007 | Suzuki | H01L 23/4985 | |
| | | | 257/668 | |
| 7,317,257 B2* | 1/2008 | See | B82Y 10/00 | |
| | | | 257/777 | |
| 7,804,161 B2* | 9/2010 | Saeki | H01L 23/3157 | |
| | | | 257/667 | |
| 8,242,615 B2* | 8/2012 | Takahashi | H01L 21/563 | |
| | | | 257/737 | |
| 8,384,118 B2* | 2/2013 | Schiaffino | H01L 33/0079 | |
| | | | 257/99 | |
| 8,384,121 B2* | 2/2013 | Tischler | H01L 23/4985 | |
| | | | 257/99 | |
| 8,405,227 B2* | 3/2013 | Tanida | H01L 21/563 | |
| | | | 257/667 | |
| 8,541,801 B2* | 9/2013 | Kim | H01L 33/56 | |
| | | | 257/98 | |
| 9,059,149 B2* | 6/2015 | Kwon | H01L 23/481 | |
| 2002/0195703 A1* | 12/2002 | Kameda | H01L 21/563 | |
| | | | 257/710 | |
| 2004/0097095 A1 | 5/2004 | Kasue et al. | | |
| 2005/0051885 A1* | 3/2005 | Weng | H01L 21/563 | |
| | | | 257/687 | |
| 2005/0121310 A1* | 6/2005 | Yamada | H01L 21/563 | |
| | | | 204/192.12 | |
| 2006/0022316 A1* | 2/2006 | Huang | H01L 21/56 | |
| | | | 257/676 | |
| 2006/0043555 A1* | 3/2006 | Liu | H01L 27/14618 | |
| | | | 257/680 | |
| 2007/0257901 A1* | 11/2007 | Gotou et al. | 345/212 | |
| 2008/0061312 A1* | 3/2008 | Gao et al. | 257/99 | |
| 2008/0237892 A1 | 10/2008 | Saeki | | |
| 2009/0108426 A1* | 4/2009 | Meng | H01L 27/14618 | |
| | | | 257/680 | |
| 2009/0230409 A1 | 9/2009 | Basin et al. | | |
| 2011/0210411 A1* | 9/2011 | Binapal | B81C 1/00238 | |
| | | | 257/427 | |
| 2011/0223696 A1 | 9/2011 | Basin et al. | | |
| 2011/0291143 A1* | 12/2011 | Kim et al. | 257/98 | |
| 2012/0139102 A1* | 6/2012 | Rahman | H01L 21/563 | |
| | | | 257/737 | |
| 2013/0026655 A1* | 1/2013 | Lee | H01L 23/13 | |
| | | | 257/777 | |

FOREIGN PATENT DOCUMENTS

| | | |
|---|---|---|
| JP | 2001-223391 A | 8/2001 |
| JP | 2004-055632 A | 2/2004 |
| JP | 2004-172160 A | 6/2004 |
| JP | 2004-179623 A | 6/2004 |
| JP | 2007-134376 A | 5/2007 |
| JP | 2007-189005 A | 7/2007 |
| JP | 2007-281260 A | 10/2007 |
| JP | 2008-124088 A | 5/2008 |
| JP | 2008-252027 A | 10/2008 |
| JP | 2011-514688 A | 5/2011 |
| JP | 2011-171426 A | 9/2011 |

* cited by examiner

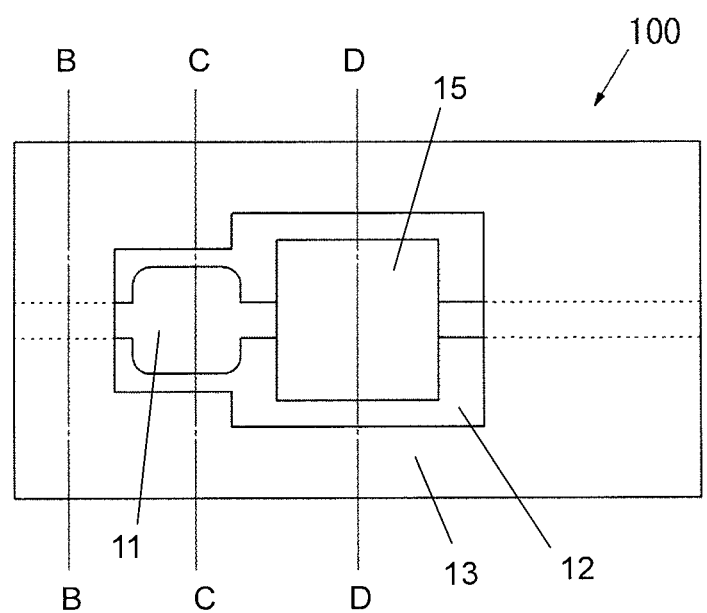
F I G. 1A

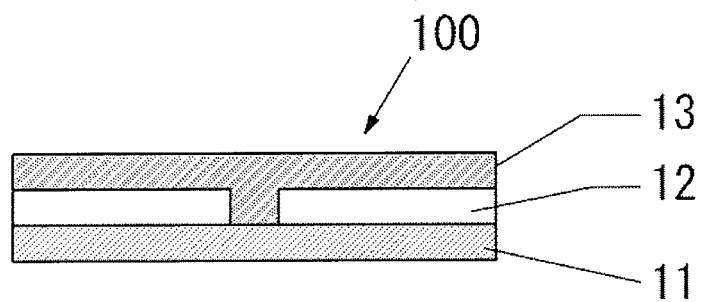
F I G. 1B
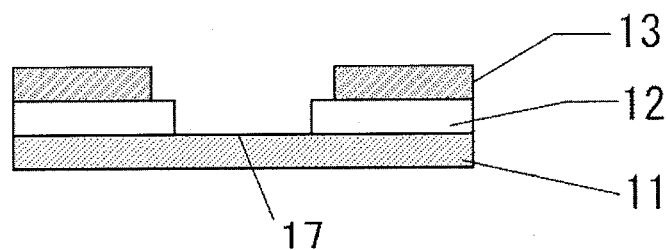
F I G. 1C
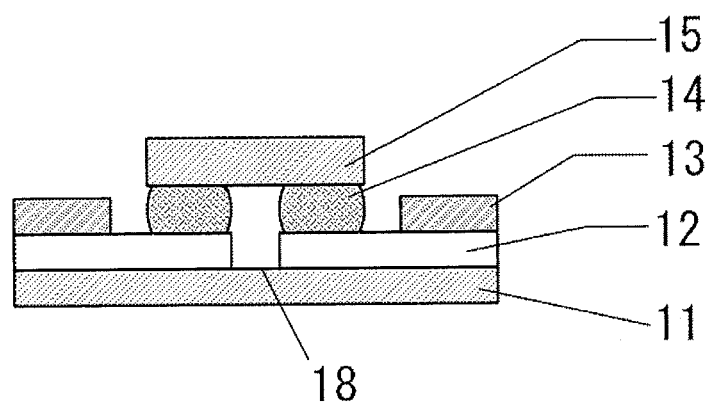
F I G. 1D

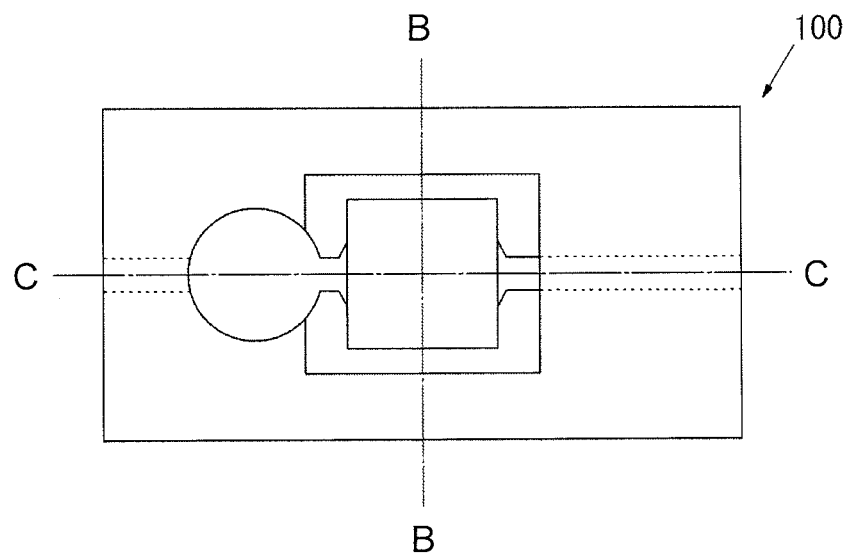
F I G. 3A
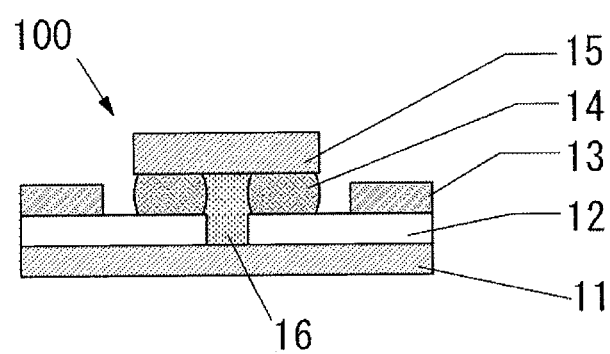
F I G. 3B
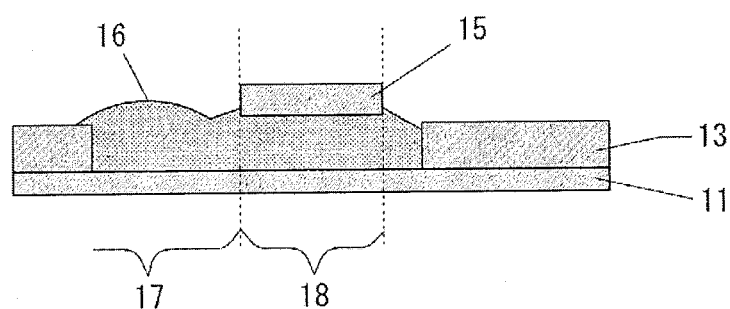
F I G. 3C

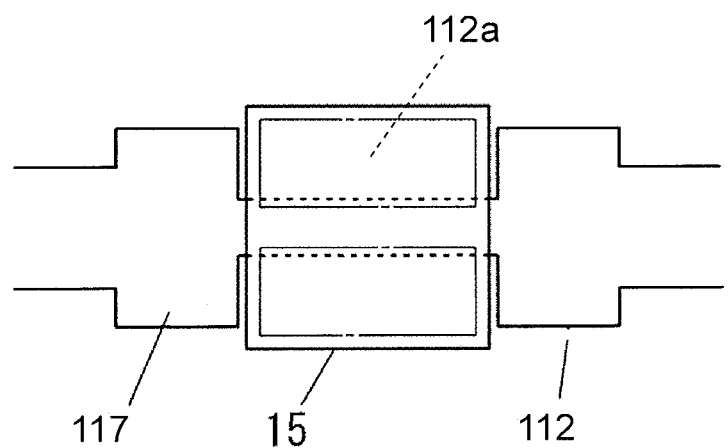
F I G. 5
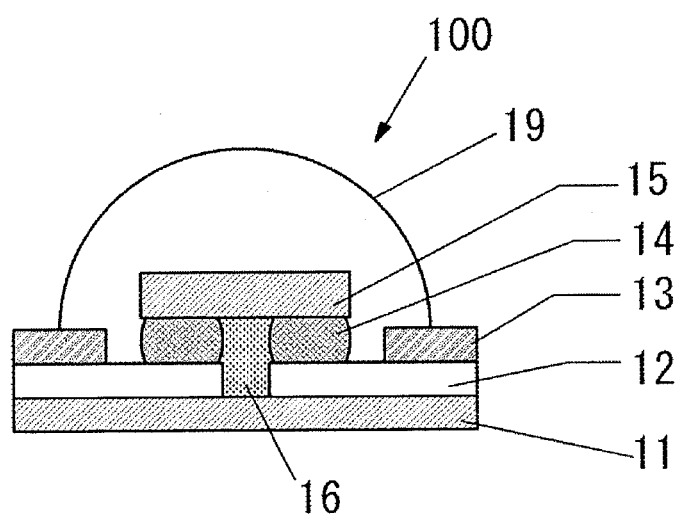
F I G. 6

LIGHT EMITTING DEVICE AND METHOD OF MANUFACTURING THE SAME

CROSS-REFERENCE TO RELATED APPLICATIONS

This application claims priority to Japanese Patent Application No. 2012-160183 filed on Jul. 19, 2012. The entire disclosure of Japanese Patent Application No. 2009-134281 is hereby incorporated herein by reference.

BACKGROUND OF THE INVENTION

1. Field of the Invention

The present invention relates to a light emitting device usable for indicators, lighting apparatuses, displays, backlight of liquid crystal displays, and the like, and a method of manufacturing the same.

2. Discussion of the Related Art

In recent years, various electronic components have been proposed and are put in practical use, and increasingly high performance has been required on such components. In particular, electric components are required for maintaining performance for a long period of time even under severe environment. Light emitting devices employing a semiconductor light emitting element such as a light emitting diode (LED) are no exception to such requirements. That is, requirements for higher performance in the area of general lighting, in-vehicle lighting, and the like, is growing daily, and higher output (higher luminance) and higher reliability have been demanded. A further demand is to supply such a device at a low price while fulfilling those requirements.

In general, a light emitting device includes a support member for mounting various electronic components such as a semiconductor light emitting element (hereinafter may be referred simply as "light emitting element") and a protective element to prevent damage on the semiconductor light emitting element caused by static electricity, and electrically conductive wirings for supplying electric power to those electronic components. In addition to those components described above, a sealing member to protect such electronic components from external environment may also be included.

In order to enhance the light extracting efficiency and to obtain a light emitting device of higher output power, it is important for such light emitting devices to reduce the absorption loss of light due to the materials of the support member, the conductive wirings, and sealing member etc.

Thus, for example, as described in JP 2007-281260A and JP 2004-055632A, a light-reflective resin layer may be arranged on the surface of the support member to reduce the absorption loss of light from the light emitting element and also to improve the light extracting efficiency.

Also, as described for example in JP 2011-514688A, in the case of a light emitting element which is mounted on a support member with a pair of positive and negative electrodes disposed on a same surface side of the light emitting element being connected to respective electrically conductive wirings with an electrically conductive member, in other words, in the case of so-called face-down mounted light emitting element, a space formed between the light emitting element and the support member may be filled with an underfill material, to prevent leakage of light from the underside of the light emitting element and thus to improve the light extracting efficiency.

However, as described in JP 2011-514688A, due to its small surface tension, an underfill material tends to cover the side surfaces of the light emitting element when the underfill material is applied to fill the space formed between the light emitting element and the support member. As a result, light emitted from the side surfaces of the light emitting element is reflected by the underfill material which covers the side surfaces of the light emitting element and returned into the light emitting element. Further, the return light may be absorbed by the electrodes or the like, which may result in a decrease in the light extracting efficiency of the light emitting device.

Also, in the case where the underfill material is applied to fill the space formed under the light emitting element which is mounted in a face-down manner, the dispenser is generally placed as close as to a side surface of the light emitting element to supply the underfill material from the dispenser. At this time, a part of the underfill material may come in touch with the side surface of the light emitting element which may result in covering the side surface. Thus, covering the side surfaces of the light emitting element with the underfill material would result in a decrease in the light extracting efficiency of the light emitting device.

In addition, the sizes of the space formed between the face-down mounted light emitting element and the support member are rather small due to existence of a plural kinds of electrically conductive members between those, which require a very small amount of the underfill material to be supplied to fill the space. Thus, in view of the workability in the coating step of applying the underfill material, application of an appropriate amount of the underfill which does not cover the side surfaces of the light emitting element is practically difficult to perform.

The present invention is devised to solve the above-described problems, and an object of the present invention is to provide an underfill material in the space between the light emitting element and the support member without covering the side surfaces of the light emitting element.

SUMMARY

In order to solve the problems described above, a light emitting device according to one aspect includes a support member, a light emitting element, and an underfill material. The support member includes an insulating member and a pair of positive and negative electrically conductive wirings arranged on the insulating member. The light emitting element includes a pair of positive and negative electrodes respectively connected to the positive and negative electrically conductive wirings through electrically conductive members respectively. The underfill material is arranged in a space formed between the support member and the light emitting element. The positive and negative electrically conductive wirings are insulated and separated from each other by an insulating separation region arranged between the positive and negative electrically conductive wirings, the insulating separation region including a first region disposed on an outer side with respect to the light emitting element and a second region disposed directly under the light emitting element, the first region including an underfill arranging portion in which an interval between the positive and negative electrically conductive wirings is wider than in the second region. The underfill material is arranged to extend from the underfill arranging portion to the second region.

The electrically conductive wirings are preferably covered with a resist except for the portions where the electrically conductive members are arranged. It is preferable that a half or greater portion of the side surfaces of the light emitting element is not covered with the underfill material. The electrically conductive wirings preferably have a solder coating on a surface thereof.

A method of manufacturing a light emitting device according to another aspect includes: preparing a support member including an insulating member and a pair of positive and negative electrically conductive wirings arranged on the insulating member by forming an insulating separation region, in which the positive and negative electrically conductive wirings are insulated and separated from each other by a part of the insulating member arranged between the positive and negative electrically conductive wirings, the insulating separation region including a first region located on an outer side of a mounting position of a light emitting element and a second region located on an inner side of the mounting position of the light emitting element with the first region including an underfill arranging portion in which an interval between the positive and negative electrically conductive wirings is wider than in the second region; mounting the light emitting element on the mounting position by connecting positive and negative electrodes of the light emitting element to the positive and negative electrically conductive wirings of the support member, respectively, with electrically conductive members; arranging an underfill material in a space formed between the support member and the light emitting element by supplying the underfill material to the underfill arranging portion by dripping so that the underfill material flows from the first region into the second region to fill a space directly under the light emitting element; and curing the underfill material after the arranging of the underfill material.

It is preferable to include a step of covering the electrically conductive wirings by a resist except for portions for arranging the electrically conductive members. The underfill material is preferably arranged at locations lower than the side surfaces of the light emitting element. As a manufacturing a light emitting device, it is preferable to further include a step of forming a solder covering on the surfaces of the electrically conductive wirings.

It is preferable that the light emitting element described above has a rectangular shape, and the underfill material is flow-applied from the first region to the second region in an approximately the same direction as the lateral direction of the light emitting element.

It is preferable that, in a top view, the electrically conductive wirings has a protruded portion having a width which is approximate the same as the width of the light emitting element, and the underfill arranging portion is provided adjacent to the protruded portion.

According to the present invention, in the step of supplying an underfill material by dripping, instead of bringing a dispenser as close as possible to a surface of a light emitting element to supply an underfill material from the dispenser, the underfill material can be injected into an underfill arranging portion which is spaced apart from a side surface of a light emitting element. That is, the underfill is not needed to be in direct contact with a side surface of the light emitting element. Thus, not only accidental adherence of the underfill material to the upper surface of the light emitting element can be prevented but also an excess amount of the underfill material can be held at a portion spaced apart from the side surface of the light emitting element without covering the side surface of the light emitting element. Accordingly, the area of the light extracting surface of the light emitting element can be increased, which allows a reduction in the loss of the output from the light emitting element, and thus the light extracting efficiency of the light emitting device can be improved.

Further, in the present invention, the underfill arranging portions for injecting the underfill material may be provided by alternating the arranging pattern of the electrically conductive wires which had been formerly disposed on the support member. Accordingly, other materials and a step for forming such specified portions can be omitted, and formation of the portions to be injected with the underfill can be facilitated easily by altering the arranging pattern of the electrically conductive wires.

Moreover, with the use of the arrangement pattern of the electrically conductive wires which had been formerly disposed on the support member, a wirings pattern which allows obtaining of so-called self-alignment effect can be formed by using portions of the wirings pattern at positions for injecting the underfill material. That is, at the time of connecting the electrodes of the light emitting element by respective electrically conductive members, through the use of the fluidity of the melted electrically conductive member, a wirings pattern can be obtained, along which the light emitting element orients.

BRIEF DESCRIPTION OF THE DRAWINGS

FIG. 1A is a top view and FIG. 1B to FIG. 1D are cross-sectional views each showing a light emitting device of an example of the present invention.

FIG. 3A is a top view and FIG. 3B and FIG. 3C are cross-sectional views each showing a light emitting device of an example of the present invention.

FIG. 5 is a top view of a support member of another example of the present invention.

FIG. 6 is a cross-sectional view showing a light emitting device of an example of the present invention.

DETAILED DESCRIPTION OF EMBODIMENTS

Figure 2A:
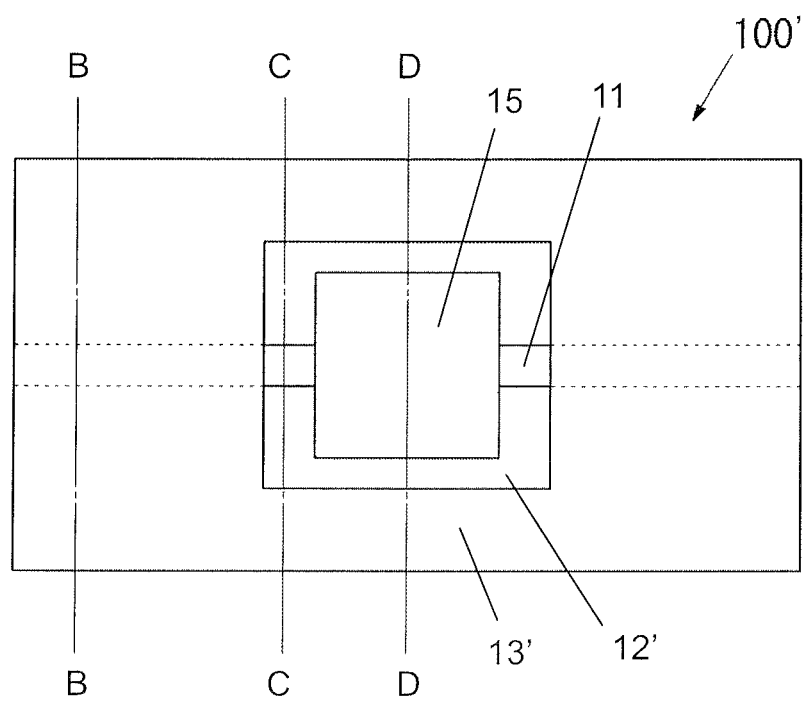
FIG. 2A is a top view and FIG. 2B to FIG. 2D are cross-sectional views each showing a light emitting device of a comparative example.

In order to solve the problems described above, the inventor conducted various experiments for a light emitting device which includes a support member made up of a pair of positive and negative electrically conductive wirings arranged on an insulating material, a light emitting element having a pair of positive and negative electrodes connected to the pair of positive and negative electrodes respectively, and an underfill material arranged in the space formed between the support member and the light emitting element. As a result, the inventors have succeeded at solving the above problems by fabricating a construction as described below.

That is, in an embodiment of the present invention, a pair of electrically conductive wirings disposed on a support member are insulated and separated from each other by exposed insulating material, and in a top view of the light emitting device, the insulated and separated region includes a first region protruded outward of the light emitting element and a second region which is continuous to the first region and is located directly under the light emitting element. Further, the first region includes an underfill arranging portion arranged between the positive and negative electrically conductive wirings spaced apart from each other with a distance greater than the corresponding length of the second region. The underfill material is disposed extended from the underfill arranging portion to the second region.

A method of manufacturing a light emitting device according to an embodiment of the present invention includes steps of at least (1) to (4) to be described below.

(1) First, a support member is prepared. That is, in a support member according to an embodiment, a pair of positive and negative electrically conductive wirings are insulated from each other by an exposed insulating material which is a constituent material of the support member, and the insulated and separated region includes a first region at an outer side of the location for mounting the light emitting element and a second region which is continuous to the first location and within the location for mounting the light emitting element. Further, the first region includes an underfill arranging portion arranged between the positive and negative electrically conductive wirings spaced apart from each other with a distance greater than the corresponding length of the second region.

(2) Next, the light emitting element is disposed on the light emitting element arranging portion on the substrate, and the electrodes of the light emitting element are connected to the electrically conductive wirings through the electrically conductive members respectively.

(3) Further, an underfill material is applied to the underfill arranging portion by dripping. The underfill material is then allowed to flow from the first region into the second region of the insulating separation portion to fill the space directly under the light emitting element.

(4) Lastly, the underfill material is cured.

In the following, preferred embodiments of the present invention will be described in reference to the accompanying drawings. The preferred embodiments are intended as illustrative of a light emitting device to give a concrete form to technical ideas of the present invention, and the light emitting device according to the present invention is not limited to those described below.

Further, the members shown in claims attached hereto are not specifically limited to members in the embodiments. Particularly, the sizes, materials, shapes and the arrangement relationships of the members described the preferred embodiments are given as an example and not as a limitation to the scope of the invention. The sizes and the positional relationships of the members in each of drawings are occasionally shown exaggerated for ease of explanation. In the description below, the same designations or the same reference numerals denote the same or like members and duplicative descriptions will be appropriately omitted. In each constituting component of the present invention, multiple components may be constructed using the same member so that one member can serve as multiple components, or vice versa, a function of a member may be shared by multiple members.

FIG. 1A is a top view and FIG. 1B to FIG. 1D are cross-sectional views each showing a light emitting device of an example of the present invention. FIGS. 1B, 1C, and 1D are respectively cross-sectional views taken along lines B-B, C-C, and D-D shown in the top view of FIG. 1A. FIG. 3 is a top view and FIG. 3B and FIG. 3C are cross-sectional views each showing a light emitting device shown in FIGS. 1A to 1D, after the underfill is disposed. FIGS. 3B and 3C are respectively cross-sectional views taken along lines B-B and C-C shown in the top view of FIG. 3A.

Figure 2B:
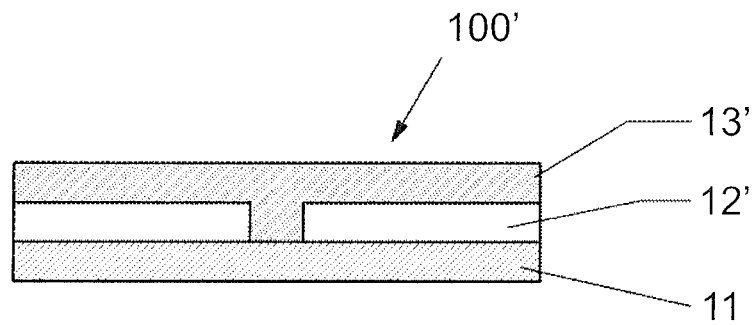
Figure 2C:
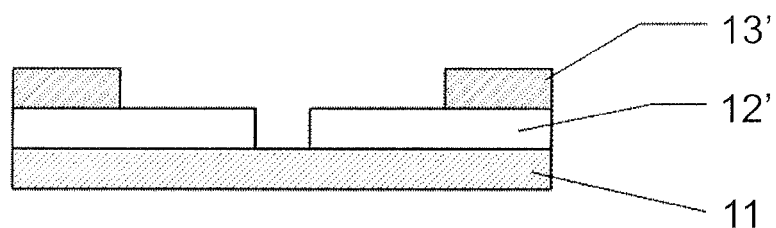
Figure 2D:
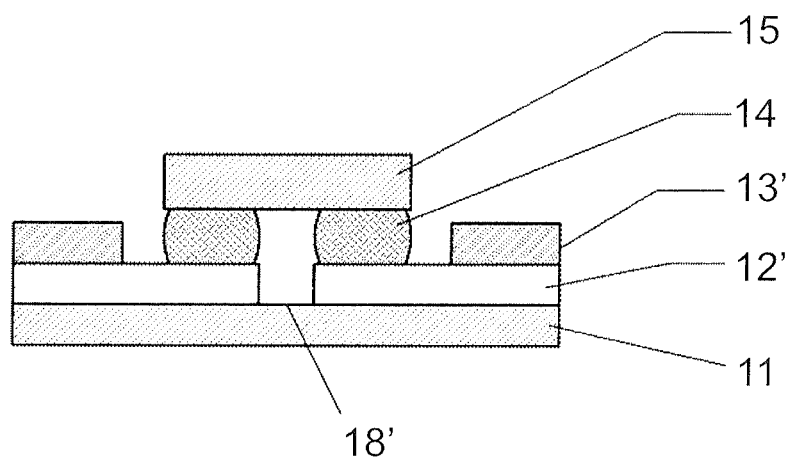
Figure 4A:
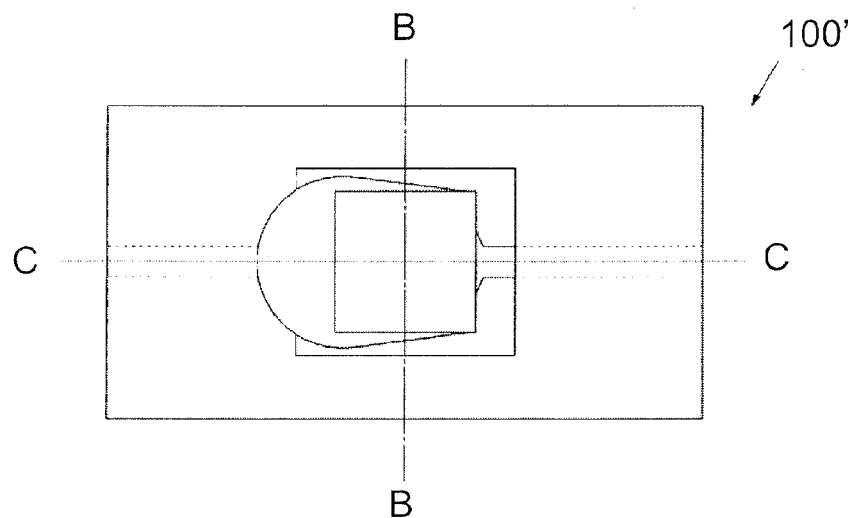
FIG. 4A is a top view and FIG. 4B and FIG. 4C are cross-sectional views each showing a light emitting device of a comparative example.
Figure 4B:
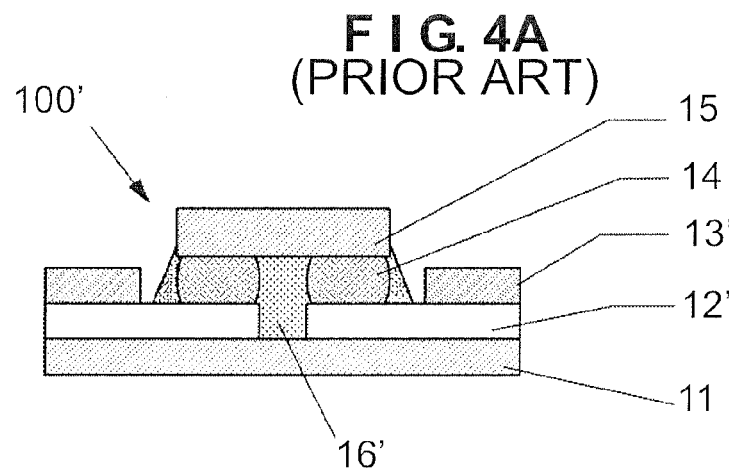
Figure 4C:
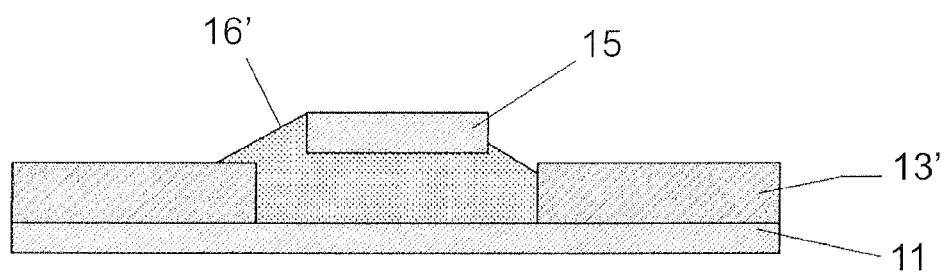

FIG. 2 is a top view and FIG. 2B to FIG. 2D are cross-sectional views each showing a light emitting device before disposing an underfill, which are shown form comparison to the present invention. FIGS. 2B, 2C, and 2D are respectively cross-sectional views taken along lines B-B, C-C, and D-D shown in the top view of FIG. 2A. FIG. 4A is a top view and FIG. 4B and FIG. 4C are cross-sectional views each showing a light emitting device shown in FIGS. 2A to 2D, after the underfill is disposed. FIGS. 4B and 4C are respectively cross-sectional views taken along lines B-B and C-C shown in the top view of FIG. 4A.

The light emitting device 100 according to the present embodiment mainly constituted of as shown in FIGS. 1A to 1D and FIGS. 3A to 3C, a support member, electrically conductive wirings 12 disposed on the support member, a resist 13 covering a part of the electrically conductive wirings 12, electrically conductive members 14 connecting electrodes of a light emitting element 15 with the electrically conductive wirings 12 respectively, the light emitting element 15 including a pair of positive and negative electrodes on the same surface side, and an underfill material 16 filled in a space formed between the light emitting element 15 and the support member. As shown in FIGS. 2A to 2D, a light emitting device 100' illustrated for comparison with the light emitting device 100 of the present embodiment has a structure similar to the structure of the light emitting device 100 of the present embodiment, except for lacking of an "underfill arranging portion 17" to be described below. In other words, the light emitting device 100' includes electrically conductive wirings 12' disposed on a support member, a resist 13' covering a part of the electrically conductive wirings 12', electrically conductive members 14' connecting electrodes of a light emitting element 15 with the electrically conductive wirings 12' respectively, the light emitting element 15 including a pair of positive and negative electrodes on the same surface side, and an underfill material 16' filled in a space formed between the light emitting element 15 and the support member.

The light emitting element 15 of the present embodiment includes a pair of positive and negative electrodes on the same surface side. The pair of positive and negative electrodes are connected to the electrically conductive wirings on the support member via a plurality of electrically conductive members respectively, with respective electrode surfaces facing to the electrically conductive wirings of the support member that is, by way of face-down mounting.

The electrically conductive wirings 12 on the support member are insulated and separated to form the positive terminal and the negative terminal so as to be in conformity with the planar shape of the electrodes of the light emitting element. This insulating separation is obtained by arranging the electrically conductive wirings so that the insulating material constituting the support member is exposed between the positive electrically conductive wirings and the negative electrically conductive wirings (i.e., the positive and negative electrically conductive wirings are not disposed on the insulating material in the insulating separation region). As described above, the region where the insulating material is exposed on the support member is referred to as an "insulating separation portion" in the present specification. Further, among the insulating separation portions, a portion extending out to outer side of the light emitting element is referred to as a first region (of the insulating separation portion) and a portion locating directly under the light emitting element is referred to as a second region (of the insulating separation portion).

In the case where the light emitting device is constituted with the light emitting element 15 is mounted in a face-down manner, the underfill material 16 is disposed in the space formed between the light emitting element 15 and the support member for the purpose of enhancing the bonding strength between the light emitting element 15 and the support member, and light propagating from the light emitting element 15 toward the support member to be reflected into the light extracting direction.

Examples of a method of arranging the underfill material 16 include applying a liquid form of the underfill material from an end of the space between the light emitting element 15 and the support member in a contacting manner. This allows the underfill material getting into the space using capillary action.

However, in such a method, the underfill material 16 is in direct contact with the light emitting element 15, so that a large amount the underfill material is adhered to the side surfaces of the light emitting element 15. That is, as shown in FIGS. 2A to 2D, when an underfill material is dripped into a conventional light emitting device, as shown in FIGS. 4A to 4C, the underfill may be disposed on the side surfaces of the light emitting element 15 which are supposed to be the light extracting surfaces, or in the worst case, the underfill material may be disposed also onto the upper surface of the light emitting element 15.

In order to solve the problems described above, in an embodiment of the present invention, as shown in FIGS. 1A to 1D, the underfill material is dripped and applied to a part of the insulating separation portion of the electrically conductive wirings 12 at a position under the light emitting element 15, and a region for retaining excess amount of the underfill material (in the current example, referred to as "underfill arranging portion" is provided. The underfill arranging portion 17 is formed in a part of the first region so that the interval between the pair of positive and negative electrically conductive wirings 12 (that is the width of the insulating separation portion) is greater than the second region 18 of the insulating separation portion. The underfill arranging portion 17 may be formed continuous to the first region at a certain distance from the light emitting element 15 or may be formed at a position as close as to a side surface of the light emitting element 15.

The surface of the insulating material exposed at the bottom surface of the insulating separation portion is, at least the thickness of the electrically conductive wire lower than the surface of the support member (that is, the upper surface of the electrically conductive wirings), so that the support member has a recessed portion (groove) on the support member at a side on which the light emitting element to be mounted. The underfill material 16 is injected by dripping into the underfill arranging portion 17 formed in a part of the insulating separation portion as described above, which then allows the underfill material flows from the underfill arranging portion 17 to the insulating separation portion (the second region 18) which is directly under the light emitting element 15 which is connected to the underfill arranging portion 17, mainly through the recessed portion (groove). The underfill material is allowed to get into the space under the light emitting element 15 which is formed with the insulating member 11. Then, the underfill material 16 is hardened to obtain a light emitting device in which the underfill 16 is arranged between the light emitting element 15 and the insulating member 11, as shown in FIGS. 3A to 3C.

According to the present invention, excess underfill material, which is greater than a sufficient amount to fill the space between the light emitting element 15 and the insulating member 111 of the support member, can be stored in the underfill arranging portion 17. Thus, even when the underfill material is applied by dripping with an extra amount, the possibility that the underfill material adheres on a side surface of the light emitting element 15 can be reduced. Thus, not only the top surface of the light emitting element but also the side surfaces of the light emitting element can be maintain as the light extracting surfaces. That is, compared to one in which the underfill material is adhered to a side surface of the light emitting element, the light extracting surface of the light emitting element can be increased, so that the optical power of the light emitting device can be increased.

Each of the components of the light emitting device 100 will be described in detail below.

Support Member

The support member is for mounting the light emitting element 15 and as shown in the figures, includes electrically conductive wirings 12 for supplying electric power to the light emitting element 15 and an insulating member 11 for arranging the electrically conductive wirings 12 to provide insulating separation.

Examples of materials for the insulating member 11 which constitutes the support member include ceramics, a resin such as a phenol resin, an epoxy resin, a polyimide resin, a BT resin (bismaleimide triazine resin), a polyphthalamide (PPA), and a polyethylene terephthalate (PET).

In view of lower cost and moldability, a resin is preferably employed for the insulating material. In order to obtain a light emitting device having excellent thermal resistance and light resistance, ceramics is preferably selected for the material of the insulating member 11. Examples of ceramics include alumina, mullite, forsterite, glass ceramics, a nitride-based ceramics (AlN etc.), and a carbon-based ceramics (SiC etc). Of these, a ceramics made of alumina or whose main component is alumina is preferable.

In the case where a resin is used for the material of the insulating member 11 which constitutes the support member, inorganic filler such as glass fiber, $SiO_2$, $TiO_2$, $Al_2O_3$ may be mixed into the resin to improve mechanical strength, decrease the coefficient of thermal expansion, and improve the optical reflectance.

Electrically Conductive Wirings 12

The electrically conductive wirings 12 is a member to be electrically connected to an electrode of the light emitting element 15 to supply electric current (electric power) from outside. That is, the electrically conductive members serve as the electrodes or a part thereof to supply electricity from outside. Generally, the electrically conductive wirings are formed at least a positive and a negative two portions spaced apart from each other. With this, as shown in FIGS. 1A to 1D, the insulating separation portion 17 (first region which is the underfill arranging portion) and 18 (second region) are formed.

The electrically conductive wirings 12 are formed at least on the upper surface of the support member which serves as the mounting surface of the light emitting element 15. The electrically conductive wirings may be arranged not only on the upper surface of the support member but also extended to the back surface of the support member.

The material of the electrically conductive wirings 12 can be appropriately selected according to the material of the insulating member 11 of the support member and the method of manufacturing. For example, in the case where ceramics is used for the material of the insulating member 11, the materials of the electrically conductive wirings 12 preferably have a high melting point so as to be able to endure the firing temperature of the ceramics sheet, and for example, a metal having a high melting point such as tungsten and molybdenum is preferably used. Further, using a technique such as plating, sputtering, vapor deposition or the like, another metal material such as nickel, gold, or silver may be applied to cove the electrically conductive wirings.

In the case where a glass epoxy resin is used for the material of the insulating member 11 of the support member, a material that is easy to process is preferably employed for the electrically conductive wirings 12. Also, in the case where an injection-molded epoxy resin is used, the electrically conductive wirings 12 are preferably made of a material that is easy to process by way of punching, etching, bending, or the like, and also that has relatively high mechanical strength. Examples thereof include metal layer, lead frame, or the like, made of a metal such as copper, aluminum, gold, silver, tungsten, iron, and nickel or iron-nickel alloy, phosphor bronze, copper-iron alloy and molybdenum. The surface thereof may further be covered with a metal material. The material thereof is not specifically limited, and for example, silver or an alloy of silver and a metal such as copper, gold, aluminum, or rhodium, or a multilayer film made with silver and the above-described alloys can be used. The metal material may be disposed by way of plating or other techniques such as sputtering or vapor deposition.

The electrically conductive wirings preferably include a solder coating on a surface thereof. This is for obtaining secure electrical connection with the electrodes of the light emitting element.

Resist 13

The electrically conductive wirings 12 are preferably covered with a resist 13 made of an insulating material except for the portions where the electrically conductive member 14 is disposed. That is, as shown in the drawings, a resist 13 may be arranged on the support member in order to insulate and cover the electrically conductive wirings 12.

In the case where the resist 13 is arranged, in addition to the purpose of applying the insulation on the electrically conductive wirings, by adding a white filler to be described below and which is similar to the underfill material, leakage of light can be prevented and the light extracting efficiency of the light emitting device 100 can be improved.

The underfill material 13 is not specifically limited as long as the material weakly absorb light from the light emitting element. For example, an epoxy resin, a silicone resin, a modified silicone resin, a urethane resin, an oxetane resin, an acrylic resin, a polycarbonate resin, or a polyimide resin can be employed.

In the case of disposing a resist which includes a filler, the amount of the filler to be contained in the resist may be smaller than the amount of the filler to be contained in the underfill material. This is in order to reduce the cost of inclusion of the filler and to improve the accuracy in the microscopic resist pattern employed in downsized light emitting devices.

Electrically Conductive Member 14

Examples of the electrically conductive member 14 include a conductive member, and specific examples thereof include an alloy containing Au, an alloy containing Ag, an alloy containing Pd, an alloy containing In, an alloy containing Pb—Pd, an alloy containing Au—Ga, an alloy containing Au—Sn, an alloy containing Sn, an alloy containing Au—Ge, an alloy containing Au—Si an alloy containing Al, an alloy containing Cu—In, and a mixture of a metal and a flux.

For the electrically conductive member 14, a liquid, a paste, a sold (a sheet shape, a brick shape, powder form) can be used, which can be appropriately selected according to the composition, the shape of the support member, or the like. The electrically conductive members 14 described above may be disposed as a single member or as a combination of several kinds of members. The electrically conductive members may be respectively disposed beforehand on the electrodes of the light emitting element, or may be respectively arranged on the electrically conductive wirings.

Light Emitting Element 15

The light emitting element 15 to be mounted on the support member is not specifically limited and any known light emitting elements can be used, but in the present embodiment, a light emitting diode is preferably used as the light emitting element 15.

The light emitting element 15 of any appropriate wavelength can be employed. For example, for the light emitting element which emits blue or green light, a light emitting element employing ZnSe, nitride-based semiconductor ($In_XAl_YGa_{1-X-Y}N$, $0 \leq X$, $0 \leq Y$, $X+Y \leq 1$), or GaP may be used. For the light emitting element which emits red light, GaAlAs, AlInGaP, or the like may be used. Further, a semiconductor light emitting element made of a material other than described above may also be used. The composition, color of emitted light, size and number of the light emitting element to be used can be selected appropriately according to the purpose.

In the case where a light emitting device having a fluorescent material is to obtain, it is suitable to employ a nitride semiconductor ($In_XAl_YGa_{1-X-Y}N$, $0 \leq X$, $0 \leq Y$, $X+Y \leq 1$) to emit light of a short wavelength that can efficiently excite the fluorescent material. The emission wavelength can be variously selected by the materials and the content ratio of the mixed crystal of the semiconductor layer. The positive and negative electrodes may be disposed at the same surface side or the positive and negative electrodes may be disposed at different surfaces.

The light emitting element of the present embodiment includes a substrate and a semiconductor layer stacked on the substrate. The semiconductor layer includes an n-type semiconductor layer, an active layer, and a p-type semiconductor layer disposed in this order. An n-side electrode is disposed on the n-type semiconductor layer and a p-side electrode is disposed on the p-type semiconductor layer. The substrate in the present embodiment is a light-transmissive sapphire substrate.

The electrodes of the light emitting element 15 are, as shown in FIG. 1D, mounted in a flip-chip manner on the electrically conductive wirings 12 on the surface of the support member via the electrically conductive members 14 respectively. The surface facing the surface on which the electrodes are disposed, that is, the light transmissive main surface of the sapphire substrate serves as the light extracting surface. The light emitting element 15 is arranged so as to bridge the insulated and separated positive and negative two electrically conductive wirings 12, and bonded by the electrically conductive members.

The shape of the light emitting element 15 may be a square shape as shown in the top view of the figures, or may be a rectangular shape with a longitudinal side which is a long side and a lateral side which is a short side. In the case where the light emitting element has a rectangular shape, it is preferable that the pattern of the electrically conductive wirings formed so that the connecting portion of the underfill arranging portion (first region) 17 and the second region 18 of the insulating separation portion of the electrically conductive wirings 12 are arranged at the longitudinal side of the light emitting element, that is, the direction of supply of the underfill material is approximately in the same direction as the lateral direction of the light emitting element (e.g., a direction parallel to sides of the rectangular shape of the light emitting element), and also the light emitting element is mounted in such manner. With this arrangement, compared to the case where the connecting portion is arranged at the lateral side of the light emitting element, that is, compared to the case where the direction of supply of the underfill material is in the longitudinal direction of the rectangular light emitting element, the path length of the underfill material can be reduced, so that the dripping of the underfill material can be facilitated.

Underfill Material 16

The underfill material 16 is disposed between the light emitting element 15 and the supporting member. The underfill material 16 contains a filler with a main purpose of enhancing the bonding strength between the light emitting element 15 and the support member, and further efficiently reflecting light from the light emitting element 15.

The underfill material 16 is not specifically limited as long as the material weakly absorb light from the light emitting element. For example, an epoxy resin, a silicone resin, a modified silicone resin, a urethane resin, an oxetane resin, an acrylic resin, a polycarbonate resin, or a polyimide resin can be employed.

For the filler to be contained in the underfill 16, a filler of white color further facilitates reflection of light, so that the light extracting efficiency can be improved. Also, for the filler, an inorganic compound is preferably used. The term "white color" used here refers to that the filler itself is transparent, and also that the filler appears white when there is a difference in the refractive index between the filler and the materials around the filler.

Here, the reflectance of the filler is preferably 50% or greater, more preferably 70% or greater with respect to the light of emission wavelength. With the construction as described above, the light extracting efficiency of the light emitting device 100 can be improved.

Examples of the inorganic filler material include an oxide such as $SiO_2$, $Al_2O_3$, $Al(OH)_3$, $MgCO_3$, $TiO_2$, $ZrO_2$, $ZnO_2$, $Nb_2O_5$, MgO, $Mg(OH)_2$, SrO, $In_2O_3$, $TaO_2$. HfO, SeO, and $YnO_3$, a nitride such as SiN, AlN, and AlON, and a fluoride such as $MgF_2$. Those may be used singly or as a mixture. Alternatively, a plurality of layers are separately formed and then stacked.

The particle diameter of the filler is preferably about 1 nm or greater and 10 μm or less. The particle diameter of the filler in this range can improve the resin fluidity as the underfill material, so that covering of narrow gaps can be performed without any difficulty. The particle diameter of the filler is preferably 100 nm or greater and 5 μm or less, further preferably 200 nm or greater and 2 μm or less. The shape of the filler particles may be spherical shape or a scale shape.

It is preferable that a half or greater area of the side surfaces of the light emitting element are not covered with the underfill material, which can be achieved by not only with the underfill arranging portion but further appropriately selecting and adjusting the particle size of the filler and the underfill material. This is for securing the side surfaces of the light emitting element as the light extracting surfaces.

Sealing Member 19

The sealing member according to the present embodiment is arranged on the support member for covering the light emitting element, to protect the light emitting element from external environment and to optically control light emitted from the light emitting element. In the present invention, the sealing member may be optionally employed.

Examples of the material of the sealing member include light transmissive resins such as an epoxy resin, a silicone resin, and a resin which is a mixture of those, and glass. Among those materials, a silicone resin is preferable in view of light stability and ease of molding.

Further, the light transmissive resin may contain a fluorescent material to absorb light from the light emitting element and emit light having a wavelength which is different from that of the light from the light emitting element, and/or a diffusing agent to diffuse light from the light emitting element. Also, a coloring agent may also be contained in the light transmissive resin corresponding to the emission color of the light emitting element.

The sealing member 19 may have any shape to suitably protect the light emitting element 15, but in consideration of ease of molding and optical properties, as shown in FIG. 6, a hemispherical shape is preferably employed.

The sealing member can be formed by way of compression molding or transfer molding so as to cover the light emitting element. Beside these described above, the sealing member 19 can also be formed as flows: The viscosity of the material of the sealing member 19 is adjusted to a desired value, then the sealing member 19 is applied by drops on the light emitting element 15. The deposited material is allowed to stand until a hemispherical shape, as shown in FIG. 6, is formed due to surface tension of the material. Then, the material of the sealing member 19 is hardened to obtain the sealing member 19. The latter method of does not require a mold and the sealing member can be formed in simple way. In the method as described above, the viscosity of the material of the sealing member may be adjusted with the viscosity of the material itself, as well as with the other materials such as a fluorescent material and/or a diffusion agent as described above.

The portions on the support member which are covered with the resist or the underfill material which are described above preferably include at least the arranging portion of the sealing member. This is for reliably prevent the light from leaking in the light extracting direction in the light emitting device.

The following examples further illustrate the present invention in detail but are not to be construed to limit the scope thereof.

EXAMPLE 1

FIG. 1A is a top view showing a support member of a light emitting device according to the present embodiment. FIGS. 1B, 1C, and 1D are respectively cross-sectional views taken along lines B-B, C-C, and D-D shown in the top view of FIG. 1A respectively.

As shown in FIGS. 1A to 1D, the support member of the present example includes an underfill arranging portion 17 in a part of a pattern of a pair of positive and negative electrically conductive wirings disposed on the support member. More specifically, on a polyimide film having a thickness of 25 μm which is an insulating member constituting the support member, a copper foil having a thickness of 35 μm is adhered by using an adhesive agent, then, portions of the surface of the adhesive agent or the insulating member so that the copper foil becomes the electrically conductive wirings having a predetermined pattern, and thus the insulating separation portion which includes the underfill wirings portions 17 is formed. Then, a white resist layer having a predetermined pattern with a thickness of 20 μm is formed.

The underfill arranging portion 17 of the present example is, when the insulating separation portion for the pair of positive and negative electrically conductive wirings is viewed from above the light emitting device, formed in a part of a first region protruded outward of the outline of the light emitting element 15. More specifically, the first region is connected to an insulating separation portion (second region) 18 of the pair of positive and negative electrically conductive wirings arranged under the light emitting element 15, and includes regions extending linearly and approximately perpendicularly with respect to a side of a light emitting element 15 having an approximately square shape, and an underfill arranging portion 17 having an insulating separation portion with a width greater than those regions.

The underfill arranging portion of the present example has, as shown in FIG. 1A, an approximately square shape, and is disposed singly on one side with respect to the light emitting element. In the present embodiment, only one underfill arranging portion is provided at one side with respect to the light emitting element, but it is not limited to such a configuration, and a plurality of underfill arranging portion may be provided interposing the light emitting element. The shape of the underfill arranging portion is not limited to a rectangular shape and any appropriate shape such as a triangular shape, a circular shape, a polygonal shape, or the like, can be employed.

FIG. 3A is a top view and FIG. 3B and FIG. 3C are cross-sectional views each showing a light emitting device shown in FIGS. 1A to 1D, after the underfill is disposed. FIGS. 3B and 3C are respectively cross-sectional views taken along lines B-B and C-C shown in the top view of FIG. 3A.

As shown in FIGS. 3A to 3C, the underfill material 16 is arranged extended from the underfill arranging portion 17 to the second region 18 of the insulating separation portion under the light emitting element 15. Also, the side surfaces of the light emitting element 15 are such that the side surfaces of at least two sides of the light transmissive sapphire substrate are exposed without being covered with the underfill material 16, so that not only the top surface of the light emitting element 15 but also the side surfaces of the light emitting element 15 can serve as the light extracting surfaces.

Thus, as shown in FIGS. 4A to 4C, a portion corresponding to the underfill arranging portion as shown in the present example is not provided. Therefore, compared to a light emitting device in which the side surfaces of the light emitting element 15 are covered with the underfill material 16, in the light emitting device according to the present example, the area of the light extracting surfaces can be increased, so that a light emitting device with high light extracting efficiency can be obtained.

EXAMPLE 2

FIG. 5 is a top view showing a support member of a light emitting device according to the present embodiment. The light emitting device is fabricated in a similar manner as in Example 1, except for that to be described below. The electrically conductive wirings 112 according to the present example includes a protruded portion 112a having a width which is approximately the same as the width of the light emitting element, and the underfill arranging portion is provided adjacent to the protruded portion. That is, as shown in FIG. 5, in the present example, a part of each of the pair of positive and negative electrodes disposed on the support member is formed with a protruded portion having a width approximately the same as the width of the corresponding electrode of the light emitting element 15. In the protruded portions 112a, invisible portions which are hidden behind the light emitting element 15 are shown in dotted lines in FIG. 5. Then, the underfill arranging portion 117 is provided at right and left sides of the light emitting element 15 respectively in a manner interposing the protruded portion therebetween. The protruded portion 112a is provided so that at the time of connecting the electrodes (shown by dashed lines in FIG. 5) of the light emitting element 15 and the electrically conductive wirings 112 respectively, the light emitting element can be arranged at the predetermined mounting position with precise orientation due to the self-alignment effect by the electrodes of the light emitting element 15 and the molten solder.

In the present example, a part of the shape which forms the protruded shape in a part of the wirings pattern of the electrically conductive wirings is also serves a part of the wirings pattern which forms the underfill arranging portion. As shown in the present example, a part of the wirings pattern to produce a self-aligning effect can also be used as the wirings pattern of the electrically conductive wirings which defines the underfill arranging portion.

The light emitting device according to the illustrated embodiments employs an underfill material having a high reflectance, and covering of the side surfaces of the light emitting element can be reduced to as little as possible. Accordingly, light from the light emitting element can be extracted efficiently and the light extracting efficiency can be improved.

The light emitting devices according to the illustrated embodiments can be utilized in applications such as various indicators, lighting apparatus, displays, backlight light sources for liquid crystal displays, and further, facsimiles, copiers, image reading systems in scanners or the like, and projector devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
    a support member including an insulating member and a pair of positive and negative electrically conductive wirings arranged on the insulating member;
    a light emitting element including a pair of positive and negative electrodes respectively connected to the positive and negative electrically conductive wirings through electrically conductive members; and
    an underfill material arranged in a space formed between the support member and the light emitting element, wherein
    the positive and negative electrically conductive wirings are insulated and separated from each other by an insulating separation region arranged between the positive and negative electrically conductive wirings, the insulating separation region including a first region disposed on an outer side with respect to the light emitting element and a second region extending throughout an area disposed directly under the light emitting element, an interval between the positive and negative electrically conductive wirings being constant in the second region, and the first region including an underfill arranging portion in which the interval between the positive and negative electrically conductive wirings is wider than the interval in the second region, and
    the underfill material is in contact with the light emitting element and a part of the insulating member in which the positive and negative electrically conductive wirings are not arranged, the underfill material being arranged as a single layer that extends continuously from the underfill arranging portion in the first region to the second region such that the underfill material is in contact with the positive and negative electrically conductive wirings and the insulating member in the second region disposed directly under the light emitting element.

2. The light emitting device according to claim 1, wherein the positive and negative electrically conductive wirings are covered with a resist except for portions where the electrically conductive members are arranged.

3. The light emitting device according to claim 1, wherein a half or greater portion of side surfaces of the light emitting element is not covered with the underfill material.

4. The light emitting device according to claim 1, wherein the positive and negative electrically conductive wirings include a solder coating on surfaces thereof.

5. The light emitting device according to claim 1, wherein the positive and negative electrically conductive wirings are disposed in regions directly under the light emitting element toward regions on the outer side with respect to the light emitting element.

6. The light emitting device according to claim 1, wherein the underfill material is configured and arranged to reflect light.

7. The light emitting device according to claim 1, wherein the positive and negative electrically conductive wirings are arranged on a top surface of the insulating member.

8. The light emitting device according to claim 1, wherein the positive and negative electrically conductive wirings are separated from each other by removing the wiring material in the insulating separation region so as to expose the insulating member disposed under the wiring material.

9. The light emitting device according to claim 1, wherein the first region is disposed along a direction in which the second region extends directly under the light emitting element.

10. The light emitting device according to claim 1, wherein a majority of an outer circumference of the first region is surrounded by either the positive or negative electrically conductive wiring.

11. A method of manufacturing a light emitting device comprising:
preparing a support member including an insulating member and a pair of positive and negative electrically conductive wirings arranged on the insulating member by forming an insulating separation region, in which the positive and negative electrically conductive wirings are insulated and separated from each other by a part of the insulating member arranged between the positive and negative electrically conductive wirings, the insulating separation region including a first region located on an outer side of a mounting position of a light emitting element and a second region extending throughout an inner side of the mounting position of the light emitting element with an interval between the positive and negative electrically conductive wirings being constant in the second region, and the first region including an underfill arranging portion in which the interval between the positive and negative electrically conductive wirings is wider than the interval in the second region;
mounting the light emitting element on the mounting position by connecting positive and negative electrodes of the light emitting element to the positive and negative electrically conductive wirings of the support member, respectively, with electrically conductive members, the light emitting element having a rectangular shape with a pair of long sides and a pair of short sides;
arranging an underfill material in a space formed between the support member and the light emitting element by supplying the underfill material to the underfill arranging portion by dripping so that the underfill material flows along a direction approximately parallel to the short sides of the rectangular shape of the light emitting element from the first region into the second region to fill a space directly under the light emitting element so as to be in contact with the light emitting element and the insulating member, which is exposed after a wiring material is removed in the first region, and so as to extend continuously from the underfill arranging portion to the second region such that the underfill material is in contact with the positive and negative electrically conductive wirings and the insulating member in the second region disposed directly under the light emitting element; and
curing the underfill material after the arranging of the underfill material.

12. The method of manufacturing a light emitting device according to claim 11, further comprising
covering the positive and negative electrically conductive wirings by a resist except for portions for arranging the electrically conductive members.

13. The method of manufacturing a light emitting device according to claim 11, wherein
the arranging of the underfill material includes disposing the underfill material on a lower side of side surfaces of the light emitting element.

14. The method of manufacturing a light emitting device according to claim 11, further comprising
disposing a solder coating on respective surfaces of the positive and negative electrically conductive wirings.

15. The method of manufacturing a light emitting device according to claim 11, wherein
each of the positive and negative electrically conductive wirings includes a protruded portion having a width approximately the same as a width of the light emitting element and the underfill arranging portion is formed adjacent to the protruded portions.

16. The method of manufacturing a light emitting device according to claim 11, wherein
the preparing of the support member and the mounting the light emitting element include arranging the positive and negative electrically conductive wirings in regions directly under the light emitting element toward regions on the outer side with respect to the light emitting element.

17. The method of manufacturing a light emitting device according to claim 11, wherein
the underfill material is configured and arranged to reflect light.

18. The method of manufacturing a light emitting device according to claim 11, wherein
the preparing of the support member includes forming the positive and negative electrically conductive wirings on a top surface of the insulating member.

19. The method of manufacturing a light emitting device according to claim 11, wherein
the preparing of the support member includes forming the wiring material on the insulating member, and removing a part of the wiring material in the insulating separation region so as to expose the insulating member disposed under the wiring material.

* * * * *